(12) United States Patent
Miyatake

(10) Patent No.: US 10,714,158 B2
(45) Date of Patent: *Jul. 14, 2020

(54) TWO-STEP DATA-LINE PRECHARGE SCHEME

(71) Applicant: Micron Technology, Inc., Boise, ID (US)

(72) Inventor: Shinichi Miyatake, Chuo-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/269,886

(22) Filed: Feb. 7, 2019

(65) Prior Publication Data
US 2019/0172508 A1 Jun. 6, 2019

Related U.S. Application Data

(63) Continuation of application No. 15/351,586, filed on Nov. 15, 2016, now Pat. No. 10,236,040.

(51) Int. Cl.
| | |
|---|---|
| *G11C 7/12* | (2006.01) |
| *G11C 11/4091* | (2006.01) |
| *G11C 11/4094* | (2006.01) |
| *G11C 7/10* | (2006.01) |

(52) U.S. Cl.
CPC ............ *G11C 7/12* (2013.01); *G11C 11/4091* (2013.01); *G11C 11/4094* (2013.01); *G11C 7/1048* (2013.01)

(58) Field of Classification Search
None
See application file for complete search history.

(56) References Cited

U.S. PATENT DOCUMENTS

| | | | |
|---|---|---|---|
| 6,304,069 B1 | 10/2001 | Tatsumi | |
| 2003/0123311 A1* | 7/2003 | Park | G11C 7/12 365/203 |
| 2005/0195669 A1 | 9/2005 | Sim | |
| 2007/0070746 A1 | 3/2007 | Han | |
| 2010/0290300 A1 | 11/2010 | Takahashi et al. | |
| 2018/0137899 A1 | 5/2018 | Miyatake | |

* cited by examiner

*Primary Examiner* — James G Norman
(74) *Attorney, Agent, or Firm* — Schwegman Lundberg & Woessner, P.A.

(57) ABSTRACT

Apparatus and methods are disclosed, including an apparatus having a first transistor configured to be coupled to a first bit line, and a control circuit configured to supply a gate of the first transistor with a first voltage to turn on the first transistor, and to supply the gate of the first transistor with a second voltage higher than the first voltage to strengthen a current drive capability of the first transistor.

25 Claims, 4 Drawing Sheets

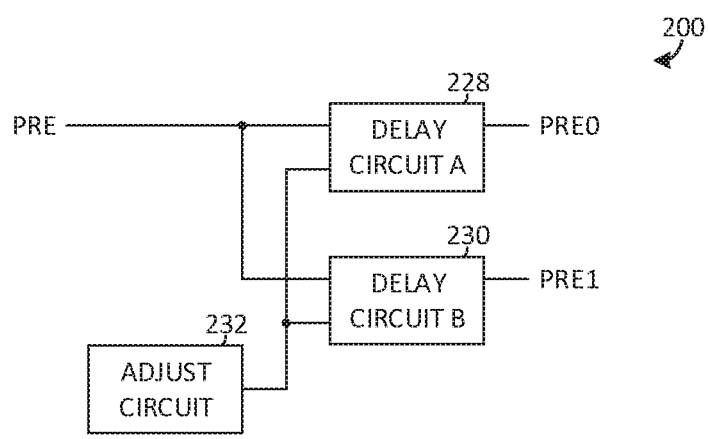
FIG. 2
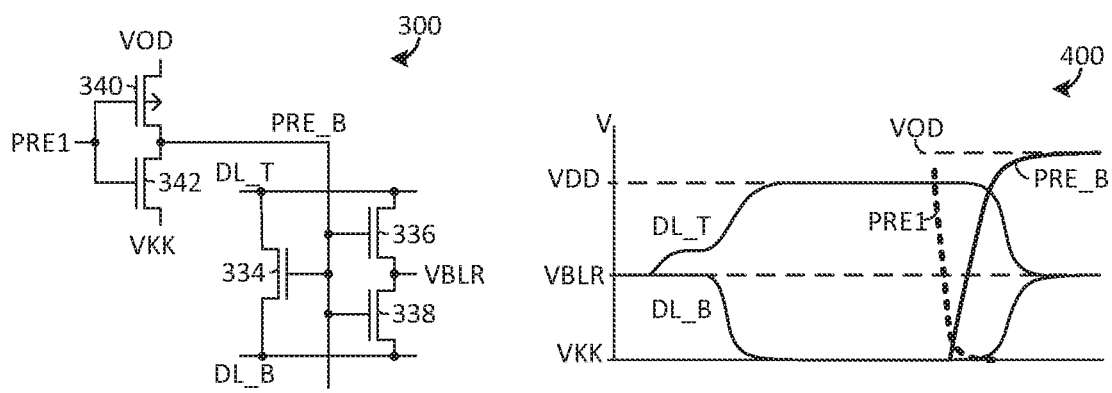
FIG. 3
PRIOR ART
FIG. 4
PRIOR ART
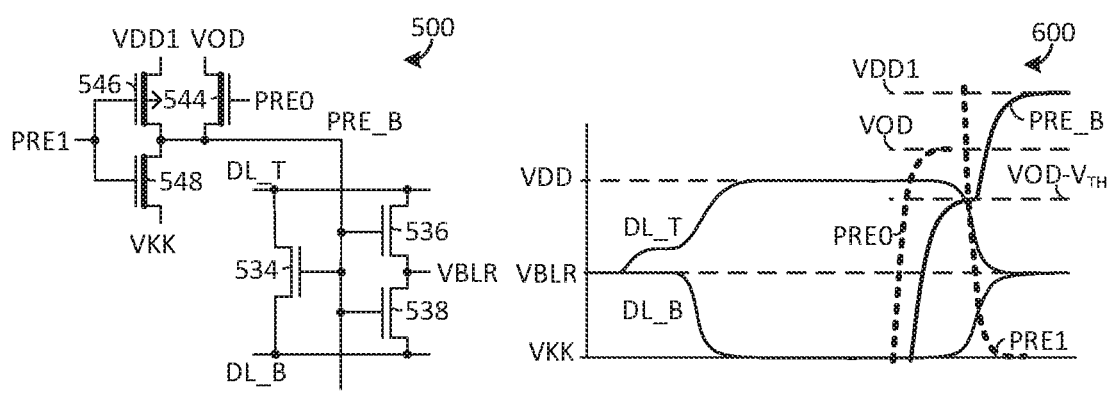
FIG. 5
FIG. 6

TWO-STEP DATA-LINE PRECHARGE SCHEME

PRIORITY APPLICATION

This application is a continuation of U.S. application Ser. No. 15/351,586, filed Nov. 15, 2016, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), static random-access memory (SRAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), erasable programmable ROM (EPROM), resistance variable memory, such as phase change random-access memory (PCRAM), resistive random-access memory (RRAM), or magnetoresistive random-access memory (MRAM), among others.

Each type is advantageous in specific settings. For example, DRAM, typically comprising one transistor and one capacitor per bit, is structurally very simple in contrast to other memory types (SRAM, etc.), and as such, is widely used in applications requiring low cost or high capacity. In contrast, SRAM, typically comprising four to six transistors per bit, is faster than DRAM, and is used in applications where speed is a greater concern than cost. However, it can still be advantageous to increase the speed of DRAM operation, such as by using a precharge circuit.

FIG. 3 illustrates a prior art precharge circuit 300 including a first transistor 334 to selectively couple data-line pairs (DL_T, DL_B), and second and third transistors 336, 338 to selectively couple the data-line pairs (DL_T, DL_B) to a bit-line voltage reference (VBLR) (e.g., VARY/2). The precharge circuit 300 further includes fourth and fifth transistors 340, 342 configured to receive a precharge command signal (PRE1) and to provide a precharge voltage (PRE_B) to the first, second, and third transistors 334, 336, 338.

FIG. 4 illustrates prior art operational signals 400 of the precharge circuit 300 of FIG. 3. When PRE1 is high, PRE_B is low, and vice versa, between an overdrive voltage (VOD) and a deactivation voltage (VKK) (e.g., a word-line non-select or deactivation voltage), respectively. The VOD is a voltage above a supply voltage (VARY), commonly used to amplify bit lines during sense operations, and to control the first transistor 334 (an NMOS, precharge transistor). However, if a voltage greater than the gate oxide withstand voltage is applied to a gate of a transistor, the gate oxide of the transistor can breakdown and fail.

When the fourth transistor 340 (a PMOS transistor) coupled to VOD turns on to increase a level of a control signal to the first, second, and third transistors 334, 336, 338, a voltage difference between a gate and a source of the first transistor 334 (an NMOS, precharge transistor) becomes approximately VOD (e.g., the gate of the third transistor 338 is VOD, and the source of the third transistor 338 is DL_B (e.g., VSS, 0V)). If the VOD approaches or exceeds the gate oxide withstand voltage, even if only for a short period of time, the gate insulating film of the first transistor 334 can be destroyed. Accordingly, to protect the transistors of the precharge circuit 300, the VOD must not approach or exceed a gate oxide withstand voltage (e.g., 1.5V) of the transistors.

SUMMARY

This document discusses, among other things, an apparatus, such as a precharge circuit, configured to decrease a precharge time for a bit line (or data line) of a memory circuit, increasing the overall speed of the memory, or memory operations.

Methods of forming such apparatus are also disclosed, as well as methods of operation, and other embodiments.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2 illustrates an example two-step data-line precharge circuit.

FIGS. 3-4 illustrate a prior art precharge circuit and corresponding operation signals.

FIGS. 5-6 illustrate an example precharge circuit and corresponding operation signals.

DETAILED DESCRIPTION OF PREFERRED EMBODIMENTS

In certain memory circuits, such as SRAM, DRAM, etc., a bit line (or data line) of the memory circuit is precharged to an intermediate voltage prior to accessing or performing certain operations on one or more memory cells associated with the bit line, such as to reduce the effects of charge sharing between a bit line and a bit capacitor of the memory circuit, to reduce the amount of time required to read a stored value from any one memory cell. For example, from an idle state, a row in a particular bank of memory can be activated using an activate command (ACT). A read or write burst command can be provided, initiating respective read or write bursts at the activated row. A precharge command (PRE) can be provided to close the row in the particular bank.

The intermediate voltage can include a mid-supply voltage, such as a voltage between VARY generated as an internal voltage and ground, VARY/2, or a voltage slightly above or below VARY/2, depending on the specific precharge circuit, circuit component tolerances, etc. Bit lines are commonly precharged prior to an activate command, a refresh operation, or to close a row of memory cells or prepare a bank of memory cells for the next access.

Because each bit line has a capacitance, each corresponding bit-line requires a precharge time (tRP) dependent on, for example, the capacitance of each bit line. The speed of the memory circuit, or the number of operations that can be performed by the memory circuit in a given period of time, depends on, among other things, the precharge time. Accordingly, reducing the capacitance of each bit line can increase the speed of the memory circuit. However, there are limits to reducing capacitance of the bit line, as well as performance tradeoffs.

The present inventor has recognized, among other things, a precharge circuit and associated method to decrease a precharge time for a bit line (or data line) of a memory circuit (e.g., a DRAM circuit), increasing the overall speed of the memory circuit, or the speed of specific memory operations.

In an example, the precharge time required to charge a bit line to a specified intermediate voltage can be decreased using a higher precharge voltage. However, providing a sudden high voltage to a precharge transistor (e.g., a metal-oxide-semiconductor field-effect transistor (MOSFET)) can, in certain examples, cause a gate-oxide breakdown in the precharge transistor. To prevent such breakdown and improve reliability, a two or more step voltage precharge control can be used to more gradually provide a high precharge voltage (e.g., higher than the specified intermediate voltage) to the precharge transistor.

The precharge circuit disclosed herein will be described with respect to a DRAM sense amplifier; however, such circuits and methods can be used with one or more other memory circuits that may benefit from a high precharge voltage (e.g., a precharge voltage higher than a mid-supply voltage).

Figure 1:
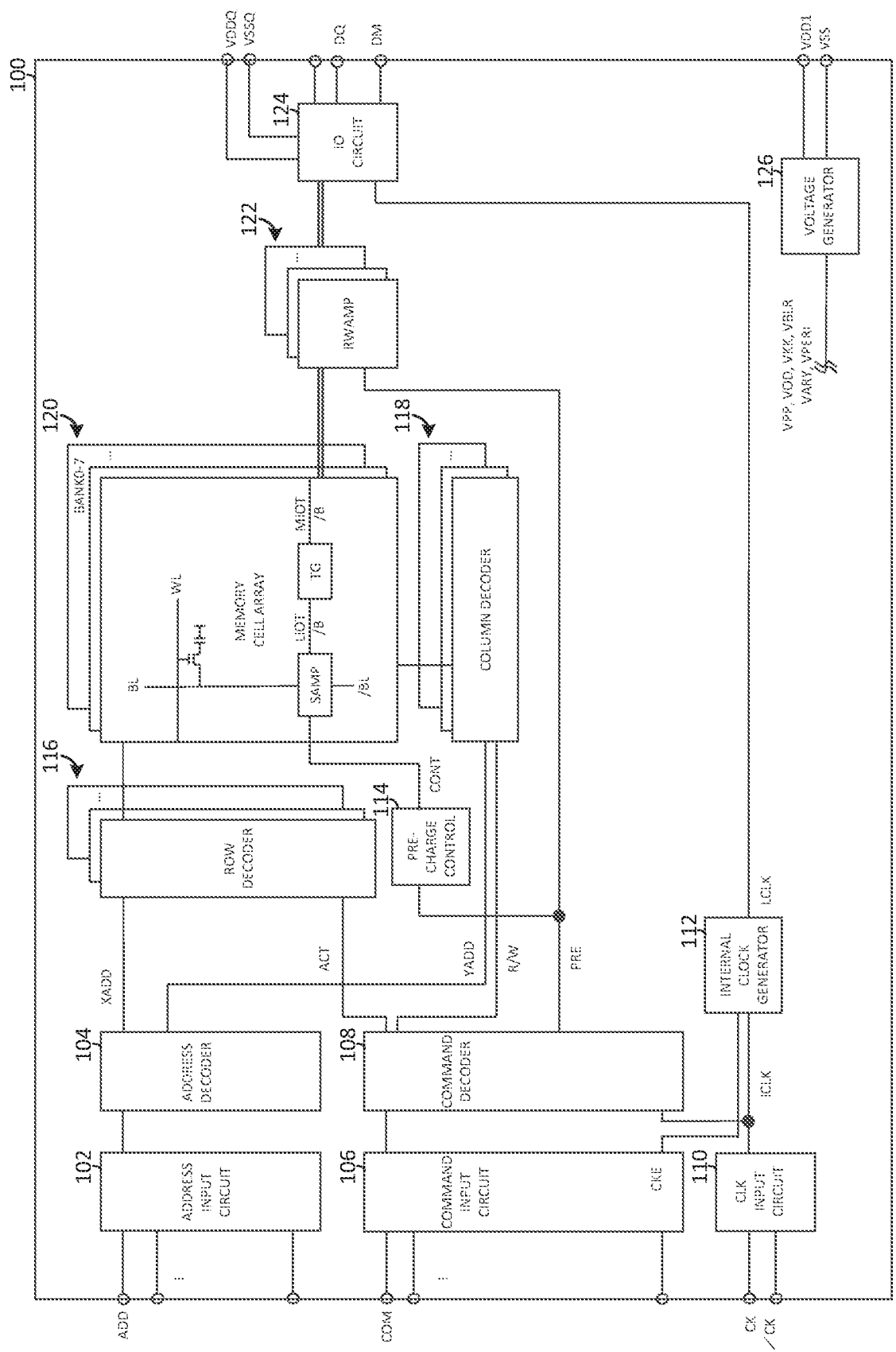
FIG. 1 illustrates an example memory device.

FIG. 1 illustrates an example memory device 100 including a memory cell array 120 having a plurality of memory cells (e.g., DRAM cells), and one or more circuits or components to provide communication with, or perform one or more memory operations on, the memory cell array 120. The memory cell array 120 illustrated in FIG. 1 includes 8 banks of DRAM cells (BANK0-7), but in other examples can include more or less banks or arrays of DRAM or other memory cells.

The memory device 100 can include an address input circuit 102 to receive address signals (e.g., ADD), and an address decoder 104 to decode the address signals and provide information (e.g., XADD, YADD) to a row decoder 116 and a column decoder 118, respectively. The memory device 100 can include a command input circuit 106 to receive command signals (e.g., COM), and a command decoder 108 to decode the command signals and provide information (e.g., ACT, R/W, PRE) to the row decoder 116, the column decoder 118, or the precharge control circuit 114 or read/write amplifier (RWAMP) 122, respectively. The row decoder 116 and the column decoder 118 can provide row and column information to the memory cell array 120.

The memory cell array 120 includes a sense amplifier (SAMP), which can receive a precharge control signal (e.g., CONT (PRE)) from a precharge control circuit 114, and control a precharge voltage on one or more bit lines (e.g., BL, /BL (or DL_T, DL_B)) in the memory cell array 120 according to the precharge control signal. The sense amplifier can provide local input/output (IO) line pairs (LIOT/B), for example, to main I/O line pairs (MIOT/B) through a transfer gate (TG).

The RWAMP 122 can receive information from the memory cell array 120, and provide information to the input/output circuit (IO CIRCUIT) 124, which can receive external voltages (e.g., VDDQ, VSSQ) and provide data signals (e.g., DQ, DM). A clock (CLK) input circuit 110 can receive clock signals (e.g., CK, /CK) and can provide an input clock signal (ICLK) to an internal clock generator 112 and the command decoder 108. Further, the command input circuit can provide information to the internal clock generator 112. The internal clock generator 112 can provide an internal clock signal (LCLK) for the memory device 100. The memory circuit 100 can include a voltage generator 126 configured to receive external power (e.g., VDD1, VSS, etc.) and provide one or more internal voltage levels (e.g., VPP, VOD, VKK, VBLR, VARY, VPERI, etc.).

FIG. 2 illustrates an example two-step data-line precharge circuit 200 including a first delay circuit 228, a second delay circuit 230, and an adjust circuit 232. In an example, the precharge circuit 200 can be included in the precharge control circuit 114 or the memory cell array 120 of FIG. 1.

The first delay circuit (DELAY CIRCUIT A) 228 can receive a precharge command (PRE) and a control signal from the adjust circuit 232, and can provide a first precharge command (PRE0). The second delay circuit (DELAY CIRCUIT B) 230 can receive the precharge command (PRE) and the control signal from the adjust circuit 232, and can provide a second precharge command (PRE1). The first and second delay circuits 228, 230 can be configured to receive the precharge command (PRE) and provide delayed precharge signals, for example, to one or more precharge circuits, or one or more inputs to a single precharge circuit, to provide an increasing precharge voltage to a precharge transistor. In an example, the precharge command (PRE) can include the precharge control signal (CONT) from FIG. 1, or vice versa.

In an example, the precharge voltage can increase to a first precharge voltage, then to a second precharge voltage. In certain examples, the increase can be a time-based increase, such that each of the delay circuits receives the precharge command, and the first and second precharge commands (PRE0, PRE1) are based off timings of from the precharge command (PRE). In certain examples, the adjust circuit 232 can adjust the amount of delay using, for example, input from a user, such that the delay is programmable. In other examples, the adjust circuit 232 can receive information from the memory circuit, such as a voltage of one or more bit lines (or data lines), or one or more voltages on one or more transistor terminals in the memory circuit. In an example, the precharge voltage can include a stepped voltage, including two or more voltage steps or other increases from an initial or intermediate precharge voltage to a final precharge voltage.

In an example, the adjust and delay circuits 228, 230, 232 can include analog or digital circuits, including predefined, selectable, or programmable timings or delay components. In other examples, the functionality of one or more of the adjust or delay circuits 228, 230, 232 can be combined or included in one or two devices.

FIGS. 3-4 illustrate a prior art precharge circuit 300 and operation signals 400 of the precharge circuit 300. The precharge circuit 300 of FIG. 3 includes a plurality of transistors configured to receive a precharge command signal (PRE1) and to provide a precharge voltage (PRE_B), electrically isolating a data-line pair (DL_T, DL_B) from a bit-line voltage reference (VBLR (e.g., VARY/2)), and providing the precharge voltage to the bit line. Each of the plurality of transistors include a respective gate, drain, and source, and have a gate oxide withstand voltage (e.g., 1.5V) corresponding to the thickness of the gate oxide (e.g., a gate insulating film) of each of the plurality of transistors.

To protect one or more of the transistors of the precharge circuit 300 the VOD must not approach or exceed a gate oxide withstand voltage (e.g., 1.5V) of the one or more transistors. The operation signals 400 of FIG. 4 illustrate example voltage levels of the precharge circuit 300 of FIG. 3, including the DL_T, DL_B, VBLR (e.g., VARY/2), VOD, VDD, VKK (e.g., ground, 0V), PRE1, and PRE_B. In an example, the VOD can be between 1.2V and 1.35V (e.g., 1.28V), the VARY between 1V and 1.25V (e.g., 1.15V), and the VBLR between 0.5V and 0.7V (e.g., 0.6V).

FIGS. 5-6 illustrate an example two-step precharge circuit 500 and operation signals 600 for the two-step precharge circuit 500. The two-step precharge circuit 500 includes a plurality of transistors configured to receive first and second precharge command signals (PRE0, PRE1) and to provide a precharge voltage (PRE_B) using first and second voltages, electrically isolating a data-line pair (DL_T, DL_B) from a bit-line voltage reference (VBLR (e.g., VARY/2)), and providing the precharge voltage to the bit line. In an example, the first and second voltages can include an overdrive voltage (VOD), and a second supply voltage (VDD1) higher than a supply voltage (VARY) and the VOD. Each of the plurality of transistors can include a respective gate, drain, and source, and can have a gate oxide withstand voltage corresponding to the thickness of the gate oxide (e.g., a gate insulating film) of each of the plurality of transistors.

The two-step precharge circuit 500 of FIG. 5 includes first, second, and third transistors 534, 536, 538. In an example, each of the gates of each of the first, second, and third transistors 534, 536, 538 can be coupled, and configured to receive the precharge voltage (PRE_B). The first transistor 534 can selectively couple the data-line pairs (DL_T, DL_B), and the second and third transistors 536, 538 can selectively couple the data-line pairs (DL_T, DL_B) to the bit-line voltage reference (VBLR) (e.g., VARY/2), such as illustrated in the operation signals 600 of FIG. 6.

The two-step precharge circuit 500 of FIG. 5 further includes fourth, fifth, and sixth transistors 544, 546, 548, in an example, having a thicker gate insulating film than the fourth and fifth transistors 340, 342 of FIG. 3. In an example, the gate insulating film of the fourth, fifth, and sixth transistors 544, 546, 548 can be thicker than the first, second, and third transistors 534, 536, 538 of the two-step precharge circuit 500. Further, in an example, the gate insulating film of the first, second, and third transistors 534, 536, 538 can be the same as the first, second, and third transistors 334, 336, 338 of the precharge circuit 300, to maintain performance of such transistors (e.g., increased speed or reduced cost, size, or capacitance in contrast to those having thicker gate insulating film). In other examples, where performance, cost, or size allows, the gate insulating film of the first, second, and third transistors can be thicker than the first, second, and third transistors 334, 336, 338 of the precharge circuit 300, such as to allow for an even higher precharge voltage, or two or more step precharge voltage.

The gate of the fourth transistor 544 can be configured to receive the first precharge command signal (PRE0), and the gates of the fifth and sixth transistors 546, 548 can be coupled and configured to receive the second precharge command signal (PRE1). In an example, the fourth and fifth transistors 544, 546 can be opposite conductivity types (e.g., the fourth transistor 544 can include an NMOS transistor, and the fifth transistor 546 can include a PMOS transistor, etc.), such that, when receiving a "high" or "low" signal at the gates of the fourth and fifth transistors 544, 546, one transistor will be "on" (e.g., providing a low-impedance path between a source and a drain), while the other transistor will be "off" (e.g., providing a high-impedance path between a source and a drain).

As illustrated in the operational signals 600 of FIG. 6, when an activate command is issued with a row address to activate a word line corresponding to the row address, a precharge operation is deactivated. In detail, PRE1 goes high (VDD1) and PRE0 goes low (e.g., a deactivation voltage (VKK), such as a word-line non-select or deactivation voltage). After memory cell data is amplified, a read/write operation (not shown in FIG. 6) is performed, and then a precharge command is issued to close the word line. When the precharge command is issued, PRE0 goes high (e.g., turning the fourth transistor 544 "on"), the VOD is provided as the precharge voltage (PRE_B), minus a threshold voltage (VTH) (e.g., because of the voltage drop in an NMOS fourth transistor 544). And then, PRE0 falls to turn the fourth transistor 544 off and the PRE1 falls to turn on the fifth transistor 546 (and off the sixth transistor 548), and the VDD1 is provided as the PRE_B. If the fifth transistor 546 is a PMOS transistor, the VDD1 is provided as the PRE_B without subtracting a threshold voltage (VTH). When the fifth transistor 546 (e.g., a PMOS) turns on, the source level of the precharge transistor becomes higher than in the example of FIG. 3. However, even if VDD1 is greater than VOD, and greater than a gate oxide withstand voltage of first transistor 534, a voltage difference between the gate and source of the first transistor 534 does not exceed a gate oxide withstand voltage of the first transistor 534, and the gate insulating film of the first transistor 534 is protected.

The operational signals 600 of FIG. 6 illustrate example voltage levels of the precharge circuit 500 of FIG. 5, including the DL_T, DL_B, VOD, VARY, VDD1, PRE0, PRE1, PRE_B, VBLR (e.g., VARY/2). In an example, the VOD can be between 1.2V and 1.35V (e.g., 1.28V), the VARY between 1V and 1.25V (e.g., 1.15V), the VDD1 between 1.6 and 1.9V (e.g., 1.8V), or the VBLR between 0.5V and 0.7V (e.g., 0.6V). In other examples, one or more other voltages or voltage levels can be used.

In other examples, one or more of the transistors of FIG. 3 or 5 included herein can include one or more other transistors, or transistor conductivity types, in accordance with the operation or operational signals provided herein. Further, although discussed with respect to a two-step voltage increase, in other examples, one or more other number of voltage steps or other increases can be used.

Figure 7:
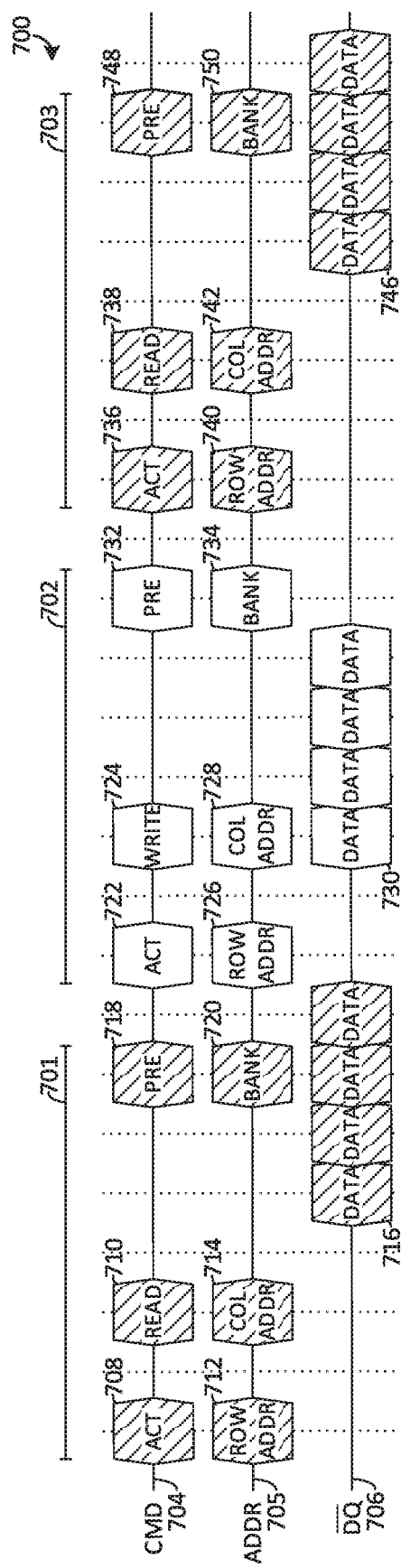
FIG. 7 illustrates an example timing diagram for a memory device.

FIG. 7 illustrates generally an example timing diagram 700 including command, address, and data signals on respective command, address, and data lines 704, 705, 706 during three example memory operations, including a first read operation 701, a second write operation 702, and a second read operation 703.

In an example, the first read operation 701 can include an activate (ACT) command 708 and a read (READ) command 710 on the command line 704, and respective row and column address signals 712, 714 on the address line 705. In certain examples, a bit line can be precharged prior to receiving the ACT command 708, for example, to close out a bank of memory after a previous operation, or to ready the bank for efficient usage at the next memory operation, etc.

In response to the ACT and READ commands 708, 710 and row and column address signals 712, 714, data (DQ) signals 716 can be read and provided on the data line 706. And each of the data signals 716 corresponds to memory data amplified in the sense amplifier. The first read operation 701 closes with a precharge operation 718 on the command line 704, for example, to close a bank of memory cells (such as a bank 720 identified on the address line 705), or to otherwise prepare the bit lines for the next memory operation using one or more of the techniques described herein.

Similarly, the first write operation 702 can follow the first read operation 701, for example, a specific time after providing the precharge operation 718. The first write operation 702 can include receiving a second ACT command 722 and a WRITE command 724 on the command line 704, and respective row and column address signals 726, 728 on the address line 705. The data to be written into the memory can be provided on the data line 706, such as illustrated, for example, using data signals 730. The first write operation 702 closes with a precharge operation 732 on the command line 704, for example, to close a bank of memory cells (such as a bank 734 identified on the address line 705), or to otherwise prepare the bit lines for the next memory operation using one or more of the techniques described herein.

The example timing diagram 700 further includes a second read operation 703, including receiving ACT and READ commands 736, 738 on the command line 704, and respective row and column address signals 740, 742 on the address line 705. The data to be read from the memory can be received on the data line 706, such as illustrated, for example, using data signals 746. The second read operation 703 closes with a precharge operation 748 on the command line 704, for example, to close a bank of memory cells (such as a bank 750 identified on the address line 705), or to otherwise prepare the bit lines for the next memory operation using one or more of the techniques described herein.

Figure 8:
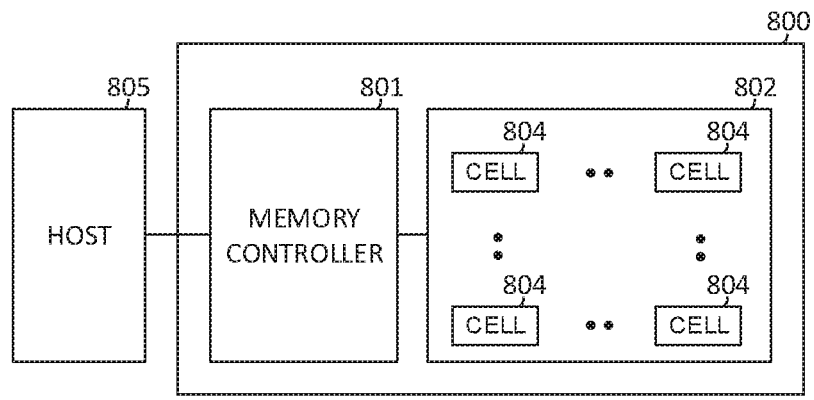
FIG. 8 illustrates an example block diagram of a memory device.

FIG. 8 illustrates an example block diagram of a memory device 800 including a memory controller 801 and a memory array 802 having a plurality of memory cells 804, and a host 805 external to the memory device 800. One or more physical interfaces can be used to transfer data between the memory device 800 and the host 805, such as a serial advanced technology attachment (SATA) interface, a peripheral component interconnect express (PCIe) interface, a universal serial bus (USB) interface, or one or more other physical connectors or interfaces. The host 805 can include a host system, such as a personal computer, a digital camera, a mobile electronic device, a memory card reader, or one or more other electronic devices external to the memory device 800.

The memory controller 801 can receive instructions from the host 805, and can communicate with the memory array 802, such as to transfer data to (e.g., write or erase) or from (e.g., read) one or more of the memory cells 804 of the memory array 802. The memory controller 801 can include, among other things, circuitry or firmware, such as a number of components or integrated circuits. For example, the memory controller 801 can include one or more memory control units, circuits, or components configured to control access across the memory array 802 and to provide a translation layer between the host 805 and the memory device 800. The memory controller 801 can include one or more input/output (I/O) circuits, lines, or interfaces to transfer data to or from the memory array 802.

The memory array 802 (e.g., a DRAM, SDRAM, or other memory array) can include a number of memory cells 804 arranged in, for example, a number of devices, planes, blocks, or physical pages. As one example, a memory device 800 can include 18,592 bytes (B) of data per page, 1836 pages per block, 848 blocks per plane, and 4 planes per device. Other examples can include other numbers or arrangements.

In operation, data is typically written to or read from the memory device 800 in pages, and erased in blocks. However, one or more memory operations (e.g., read, write, erase, etc.) can be performed on larger or smaller groups of memory cells, as desired. The data transfer size of a memory device is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 812B) as well as a number of bytes (e.g., 32B, 54B, 224B, etc.) of metadata corresponding to the user data, such as integrity data (e.g., error detecting or correcting code data), address data (e.g., logical address data, etc.), or other metadata associated with the user data.

Different types of memory cells 804 or memory arrays 802 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate).

Figure 9:
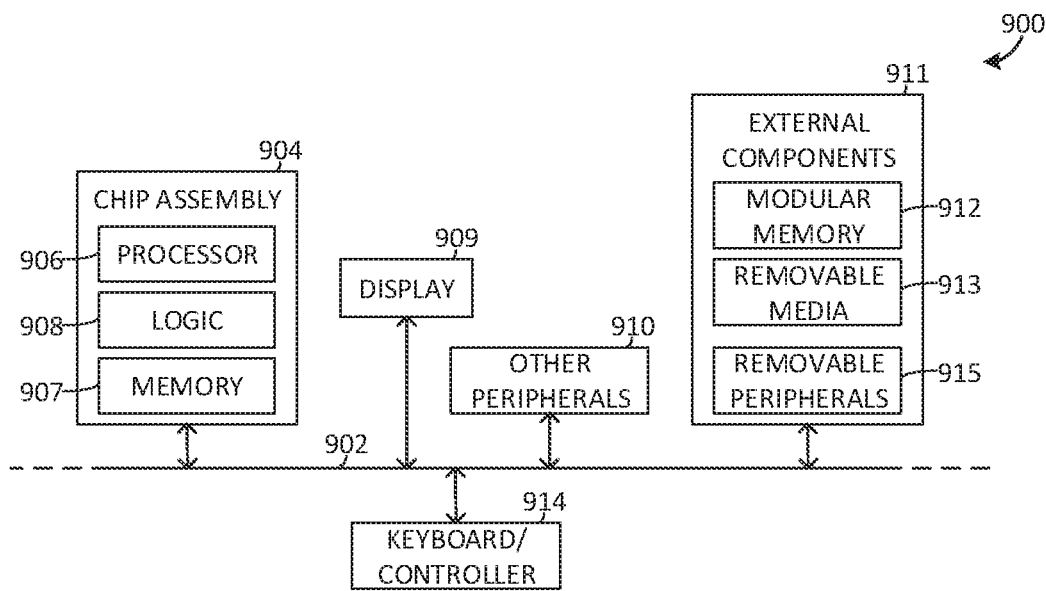
FIG. 9 illustrates an example block diagram of an information handling system.

FIG. 9 illustrates an example block diagram of an information handling system 900 incorporating at least one chip or chip assembly 904 that includes a memory device 907 according to an embodiment of the invention. In an example, the memory device 907 can include a plurality of stacked arrays of memory cell strings, such as described herein.

The information handling system 900 illustrated in FIG. 9 can include an electronic computing device, such as a desktop or laptop computer, a tablet computer, a mobile electronic device or smart phone, a gaming console, a vehicle or aircraft, or one or more other electronic device or electronic device components.

The information handling system 900 includes a system bus 902 configured to provide communication across various components of the information handling system 900. The system bus 902 can be implemented as a single bus, or as a combination of busses.

The chip assembly 904 can include a processor 906, one or more additional logic chips 908, or one or more other components. The one or more additional logic chips 908 can include, among other things, an analog-to-digital converter (ADC), or one or more other circuits, such as an application-specific integrated circuit (ASIC), etc.

The information handling system 900 can include one or more external components 911, such as external memory, which in turn, can include a modular memory 912, such as one or more hard drives, etc., or one or more removable media 913 or removable peripherals 915, such as compact disks (CDs), digital video disks (DVDs), flash drives, and the like. In certain examples, one or more of the memory devices described herein can be one or more the external components 911.

The information handling system 900 can also include a display 909, a keyboard/controller 914 (e.g., a mouse, touch screen, touch pad, or other user input device), or one or more other peripheral components 910 (e.g., speakers, microphones, cameras, etc.).

Additional Notes and Examples

An example (e.g., "Example 1") of subject matter (e.g., a precharge apparatus) may include a first bit line, a first transistor configured to be coupled to the first bit line, and a control circuit configured to supply a gate of the first transistor with a first voltage to turn on the first transistor, and to supply the gate of the first transistor with a second voltage higher than the first voltage to strengthen a current drive capability of the first transistor.

In Example 2, the subject matter of Example 1 may optionally be configured to include a second bit line, the first transistor coupled between the first bit line and the second bit line.

In Example 3, the subject matter of any one or more of Examples 1-2 may optionally be configured such that a source of the first transistor is coupled to the first bit line, and a drain of the first transistor is coupled to the second bit line.

In Example 4, the subject matter of any one or more of Examples 1-3 may optionally be configured to include a voltage terminal supplied with a third voltage different from each of the first voltage and the second voltage, wherein the first transistor is coupled between the first bit line and the voltage terminal.

In Example 5, the subject matter of any one or more of Examples 1-4 may optionally be configured to include a second bit line, wherein the first transistor is coupled between the first bit line and the second bit line, a second transistor configured to be coupled between the first bit line and the voltage terminal, and a third transistor coupled between the second bit line and the voltage terminal.

In Example 6, the subject matter of any one or more of Examples 1-5 may optionally be configured to include a first voltage terminal supplied with the first voltage and a second voltage terminal supplied with the second voltage, wherein the control circuit includes a second transistor coupled between the gate of the first transistor and the first voltage terminal and a third transistor coupled between the gate of the first transistor and the second voltage terminal.

In Example 7, the subject matter of any one or more of Examples 1-6 may optionally be configured such that the second transistor is of first conductivity type and the third transistor is of second conductivity type.

In Example 8, the subject matter of any one or more of Examples 1-7 may optionally be configured such that the control circuit includes a fourth transistor coupled between the gate of the first transistor and a third voltage terminal supplied with a lower voltage than the first and second terminals, and a gate of the fourth transistor is coupled to a gate of the third transistor.

In Example 9, the subject matter of any one or more of Examples 1-8 may optionally be configured such that a gate of the second transistor is configured to receive a first precharge control signal to control the first voltage to the gate of the first transistor, and the gates of the third and fourth transistors are configured to receive a second precharge control signal to control the second voltage to the gate of the first transistor.

In Example 10, the subject matter of any one or more of Examples 1-9 may optionally be configured such that the second voltage is greater than a gate oxide withstand voltage of the first transistor.

In Example 11, the subject matter of any one or more of Examples 1-10 may optionally be configured such that the control circuit is configured to supply the gate of the first transistor with the first voltage to turn on the first transistor for a first portion of a precharge period, and to supply the gate of the first transistor with the second voltage to strengthen the current drive capability of the first transistor for a second portion of the precharge period.

An example (e.g., "Example 12") of subject matter (e.g., a precharge method) may include supplying a gate of a first transistor, coupled to a first bit line, with a first voltage to turn on the first transistor, and supplying the gate of the first transistor with a second voltage higher than the first voltage to strengthen a current drive capability of the first transistor.

In Example 13, the subject matter of Example 12 may optionally be configured such that a source of the first transistor is coupled to the first bit line, and a drain of the first transistor is coupled to the second bit line.

In Example 14, the subject matter of any one or more of Examples 12-13 may optionally be configured such that the first transistor is coupled between the first bit line and a voltage terminal supplied with a third voltage different from each of the first voltage and the second voltage.

In Example 15, the subject matter of any one or more of Examples 12-14 may optionally be configured such that the first transistor is coupled between the first bit line and a second bit line, a second transistor is coupled between the first bit line and the voltage terminal, and a third transistor is coupled between the second bit line and the voltage terminal.

In Example 16, the subject matter of any one or more of Examples 12-15 may optionally be configured to include supplying a first voltage terminal with the first voltage, and supplying a second voltage terminal with the second voltage, wherein a second transistor is coupled between the gate of the first transistor and the first voltage terminal, and a third transistor is coupled between the gate of the first transistor and the second voltage terminal.

In Example 17, the subject matter of any one or more of Examples 12-16 may optionally be configured to include supplying a third voltage terminal with a lower voltage than the first and second voltage terminals, wherein a fourth transistor is coupled between the gate of the first transistor and the third voltage terminal, a gate of the fourth transistor is coupled to a gate of the third transistor, the second transistor is of a first conductivity type, the third transistor is of a second conductivity type, and the fourth transistor is of the first conductivity type.

In Example 18, the subject matter of any one or more of Examples 12-17 may optionally be configured to include receiving a first precharge control signal at a gate of the second transistor to control the first voltage at a gate of the first transistor, and receiving a second precharge control signal at the gates of the third and fourth transistors to control the second voltage at the gate of the first transistor.

In Example 19, the subject matter of any one or more of Examples 12-18 may optionally be configured such that the second voltage is greater than a gate oxide withstand voltage of the first transistor.

In Example 20, the subject matter of any one or more of Examples 12-19 may optionally be configured to include supplying the gate of the first transistor with the first voltage to turn on the first transistor for a first portion of a precharge period, and supplying the gate of the first transistor with the second voltage to strengthen the current drive capability of the first transistor for a second portion of the precharge period.

An example (e.g., "Example 21") of subject matter (e.g., a method) may include supplying a gate of a first transistor, coupled to a first bit line, with a first voltage to render the first transistor conductive, and changing a voltage at the gate of the first transistor from the first voltage to a second voltage that is higher in absolute value than the first voltage while keeping the first transistor conductive, wherein the second voltage causes to strengthen a current drive capability of the first transistor.

In Example 22, the subject matter of Example 21 may optionally be configured to include turning off a first switch to separate the gate of the first transistor from the first voltage, and turning on a second switch to supply the gate of the first transistor with the second voltage.

In Example 23, the subject matter of any one or more of Examples 21-22 may optionally be configured to include receiving a precharge command, wherein the supplying and the changing are carried out in response to a precharge command.

In Example 24, the subject matter of any one or more of Examples 21-23 may optionally be configured to include receiving an activate command and changing the voltage at the gate of the first transistor from the second voltage to a third voltage to turn off the first transistor responsive to the activate command.

In Example 25, the subject matter of any one or more of Examples 21-24 may optionally be configured such that the first transistor and the second transistor are different in conductivity type from each other.

An example (e.g., "Example 26") of subject matter (e.g., an apparatus) may include a first bit line, wherein the first bit line is configured to be operatively charged with a first voltage, a first transistor coupled to the first bit line, wherein the first transistor is configured, when turned on, to discharge the first bit line, and a control circuit coupled to the first transistor, wherein the control circuit is configured to supply a gate of the first transistor with a second voltage to turn the first transistor on and change a voltage of the gate of the first transistor from the second voltage to a third voltage, wherein the first voltage is between the second and the third voltages.

In Example 27, the subject matter of Examples 26 may optionally be configured such that the first transistor comprises a first gate oxide, the control circuit including a second transistor coupled to the gate of the first transistor, and the second transistor including a second gate oxide thicker than the first gate oxide.

In Example 28, the subject matter of any one or more of Examples 26-27 may optionally be configured such that the control circuit further includes a third transistor coupled to the gate of the first transistor and the third transistor comprises a third gate oxide thicker than the first oxide gate.

In Example 29, the subject matter of any one or more of Examples 26-28 may optionally be configured such that the second transistor and the third transistor are different in conductivity type from each other.

In Example 30, the subject matter of any one or more of Examples 26-29 may optionally be configured such that the second transistor is N-conductivity type and supplied with the first voltage and the third transistor is P-conductivity type and supplied with the third voltage.

An example (e.g., "Example 31") of subject matter (e.g., a system or apparatus) may optionally combine any portion or combination of any portion of any one or more of Examples 1-30 to include "means for" performing any portion of any one or more of the functions or methods of Examples 1-30, or a "machine-readable medium" (e.g., non-transitory, etc.) including instructions that, when performed by a machine, cause the machine to perform any portion of any one or more of the functions or methods of Examples 1-30.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
   a memory device comprising:
   first and second bit lines;
   a first transistor configured to selectively apply a voltage reference to the first bit line in response to a control signal;
   a second transistor configured to selectively apply the voltage reference to the second bit line in response to the control signal; and
   a control circuit configured to supply the control signal to the first and second transistors, the control circuit comprising:

a third transistor configured to selectively apply a first voltage to gates of the first and second transistors as the control signal in response to a first command signal at a first time; and a fourth transistor configured to selectively apply a second voltage higher than the first voltage to the gates of the first and second transistors as the control signal in response to a second command signal at a second time following the first time to reduce a precharge time of the first and second bit lines, wherein the second voltage is greater than gate oxide withstand voltages of the first and second transistors.

2. The system of claim 1, wherein the gate of the first transistor is coupled to the gate of the second transistor.

3. The system of claim 1, wherein the first and second transistors are configured to charge or discharge the first and second bit lines to the voltage reference.

4. The system of claim 1, wherein the first and second transistors are of a first conductivity type and the fourth transistor is of a second conductivity type.

5. The system of claim 1, wherein the control circuit comprises:
a fifth transistor configured to selectively apply a third voltage to the gates of the first and second transistors as the control signal in response to the second command signal.

6. The system of claim 5, wherein a gate of the fourth transistor is coupled to a gate of the fifth transistor, and
wherein the fifth transistor is of a first conductivity type and the fourth transistor is of a second conductivity type.

7. The system of claim 5, wherein the memory device comprises:
a sixth transistor configured to selectively couple the first bit line to the second bit line in response to the control signal,
wherein a gate of the sixth transistor is coupled to the gates of the first and second transistors.

8. The system of claim 7, wherein the first, second, fifth, and sixth transistors are of a first conductivity type and the fourth transistor is of a second conductivity type different than the first conductivity type.

9. The system of claim 7, wherein the control circuit is configured to apply the first voltage to the gates of the first, second, and sixth transistors to turn on one or more of the first, second, and sixth transistors, and to apply the second voltage to the gates of the first, second, and sixth transistors to strengthen a current drive capability of the one or more of the first, second, and sixth transistors.

10. The system of claim 1, wherein the control circuit is configured to:
control the third transistor to apply the first voltage to the gates of the first and second transistors for a first portion of a precharge period; and
control the fourth transistor to apply the second voltage to the gates of the first and second transistors for a second portion of the precharge period to strengthen a current drive capability of the first and second transistors.

11. The system of claim 1, wherein the control circuit is configured to:
apply the first voltage to the gates of the first and second transistors at the first time using the third transistor to turn on one or both of the first and second transistors; and
transition the gates of the first and second transistors from the first voltage to the second voltage at the second time using the fourth transistor to strengthen a current drive capability of one or both of the first and second transistors,
wherein, at the second time, voltages of the first and second bit lines are greater than ground and approaching the voltage reference.

12. The system of claim 1, wherein the first and second transistors comprise first and second gate oxides having a first and second thicknesses, and
wherein the third and fourth transistors comprise third and fourth gate oxides having third and fourth thicknesses, the third and fourth thicknesses thicker than the first and second thicknesses.

13. A system comprising:
a memory device comprising:
a first bit line; and
a first transistor configured to selectively apply a voltage reference to the first bit line in response to a control signal; and
a control circuit configured to apply, as the control signal, a first voltage to a gate of the first transistor in response to a first command signal at a first time, and a second voltage higher than the first voltage to the gate of the first transistor in response to a second command signal at a second time following the first time to reduce a precharge time of the first bit line,
wherein the second voltage is greater than a gate oxide withstand voltage of the first transistor.

14. The system of claim 13, wherein the control circuit is configured to:
apply the first voltage to the gate of the first transistor for a first portion of a precharge period; and
apply the second voltage to the gate of the first transistor for a second portion of the precharge period to strengthen a current drive capability of the first transistor.

15. The system of claim 14, wherein, at the second time, a voltage of the first bit line is greater than ground and approaching the voltage reference.

16. A method comprising:
selectively applying a voltage reference to a first bit line of a memory device using a first transistor in response to a control signal;
applying, using a control circuit, a first voltage to a gate of the first transistor in response to a first command signal at a first time, and a second voltage higher than the first voltage to the gate of the first transistor in response to a second command signal at a second time following the first time to reduce a precharge time of the first bit line,
wherein the second voltage is greater than gate oxide withstand voltages of the first and second transistors.

17. The method of claim 16, comprising:
selectively applying the voltage reference to a second bit line of the memory device using a second transistor in response to the control signal;
applying, using the control circuit, the first voltage to a gate of the second transistor in response to the first command signal at the first time, and the second voltage higher than the first voltage to the gate of the second transistor in response to the second command signal at the second time following the first time to reduce a precharge time of the second bit line,
wherein applying the first voltage to the gates of the first and second transistors includes using a third transistor, and wherein applying the second voltage to the gates of the first and second transistors includes using a fourth transistor.

18. The method of claim 17, wherein applying the first voltage to the gates of the first and second transistors comprises applying the first voltage for a first portion of a precharge period, and
wherein applying the second voltage to the gates of the first and second transistors comprises applying the second voltage for a second portion of the precharge period to strengthen a current drive capability of the first and second transistors.

19. The method of claim 17, wherein, at the second time, voltages of the first and second bit line are greater than ground and approaching the voltage reference.

20. A system comprising:
a memory device comprising:
first and second bit lines;
a first transistor configured to selectively apply a voltage reference to the first bit line in response to a control signal;
a second transistor configured to selectively apply the voltage reference to the second bit line in response to the control signal; and
a control circuit configured to supply the control signal to the first and second transistors, the control circuit comprising:
a third transistor configured to selectively apply a first voltage to gates of the first and second transistors as the control signal in response to a first command signal at a first time;
a fourth transistor configured to selectively apply a second voltage higher than the first voltage to the gates of the first and second transistors as the control signal in response to a second command signal at a second time following the first time to reduce a precharge time of the first and second bit lines; and
a fifth transistor configured to selectively apply a third voltage to the gates of the first and second transistors as the control signal in response to the second command signal,
wherein a gate of the fourth transistor is coupled to a gate of the fifth transistor, and
wherein the fifth transistor is of a first conductivity type and the fourth transistor is of a second conductivity type.

21. The system of claim 20, wherein the second voltage is greater than gate oxide withstand voltages of the first and second transistors.

22. The system of claim 20, wherein the first and second transistors comprise first and second gate oxides having a first and second thicknesses, and
wherein the third and fourth transistors comprise third and fourth gate oxides having third and fourth thicknesses, the third and fourth thicknesses thicker than the first and second thicknesses.

23. A system comprising:
a memory device comprising:
first and second bit lines;
a first transistor configured to selectively apply a voltage reference to the first bit line in response to a control signal;
a second transistor configured to selectively apply the voltage reference to the second bit line in response to the control signal; and
a control circuit configured to supply the control signal to the first and second transistors, the control circuit comprising:
a third transistor configured to selectively apply a first voltage to gates of the first and second transistors as the control signal in response to a first command signal at a first time; and
a fourth transistor configured to selectively apply a second voltage higher than the first voltage to the gates of the first and second transistors as the control signal in response to a second command signal at a second time following the first time to reduce a precharge time of the first and second bit lines;
wherein the first and second transistors comprise first and second gate oxides having a first and second thicknesses, and
wherein the third and fourth transistors comprise third and fourth gate oxides having third and fourth thicknesses, the third and fourth thicknesses thicker than the first and second thicknesses.

24. The system of claim 23, wherein the control circuit comprises:
a fifth transistor configured to selectively apply a third voltage to the gates of the first and second transistors as the control signal in response to the second command signal,
wherein a gate of the fourth transistor is coupled to a gate of the fifth transistor, and
wherein the fifth transistor is of a first conductivity type and the fourth transistor is of a second conductivity type.

25. The system of claim 23, wherein the second voltage is greater than gate oxide withstand voltages of the first and second transistors.

* * * * *